United States Patent [19]
Siegelman

[11] Patent Number: 5,881,883
[45] Date of Patent: Mar. 16, 1999

[54] PROTECTIVE PACKAGE HAVING A PLURALITY OF POUCHES

[76] Inventor: Burt A. Siegelman, Manhattan Beach, Calif.

[21] Appl. No.: 862,366

[22] Filed: May 23, 1997

[51] Int. Cl.⁶ .................................................... B65D 85/30
[52] U.S. Cl. .......................... 206/720; 206/701; 383/109
[58] Field of Search ................. 206/0.5, 524.7, 206/524.9, 720, 320, 232, 701; 373/109, 113

[56] References Cited

U.S. PATENT DOCUMENTS

| | | | |
|---|---|---|---|
| 3,790,067 | 2/1974 | Scheier | 383/109 |
| 3,844,409 | 10/1974 | Bodolay et al. | |
| 3,891,138 | 6/1975 | Glas | |
| 4,363,841 | 12/1982 | Snow | 383/113 |
| 4,471,872 | 9/1984 | Dedow | |
| 4,475,241 | 10/1984 | Mueller et al. | 383/113 |
| 4,648,508 | 3/1987 | Neal et al. | 206/720 |
| 4,658,958 | 4/1987 | McNulty et al. | |
| 4,875,581 | 10/1989 | Ray et al. | |
| 4,925,711 | 5/1990 | Akao et al. | 383/109 |
| 4,987,997 | 1/1991 | Raszewski et al. | |
| 5,097,949 | 3/1992 | Heldwein | |
| 5,110,639 | 5/1992 | Akao | 206/720 |
| 5,314,732 | 5/1994 | Wiste | 383/113 |
| 5,330,047 | 7/1994 | Gouge et al. | 206/524.7 |
| 5,403,096 | 4/1995 | Aagesen | 206/524.7 |

*Primary Examiner*—David T. Fidel
*Attorney, Agent, or Firm*—Kenneth M. Whitcomb

[57] ABSTRACT

A protective package is disclosed, in particular a package for transporting electrosensitive contents such as electronic components. The package includes a folded inner sheet disposed within a folded outer sheet. The two sheets are sealed together forming an inner pouch and at least one outer pouch. The inner pouch, which is used to contain the primary contents of the package, is defined by the folded inner sheet and the outer pouch, which is used to contain supporting documentation and material, is defined by both the inner and outer folded sheets. The inner sheet is made of a material, such as a laminate, which provides the contents of the inner pouch with additional protection from environmental factors such as static electricity, electromagnetic radiation or electric fields.

16 Claims, 8 Drawing Sheets

FIG. 3b
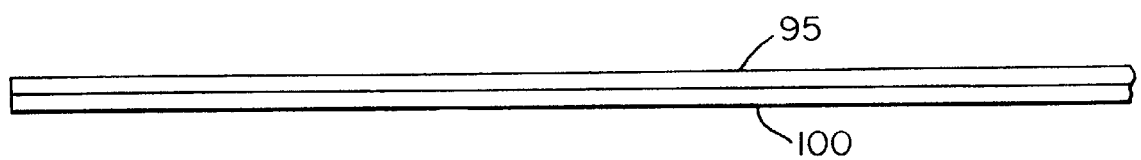
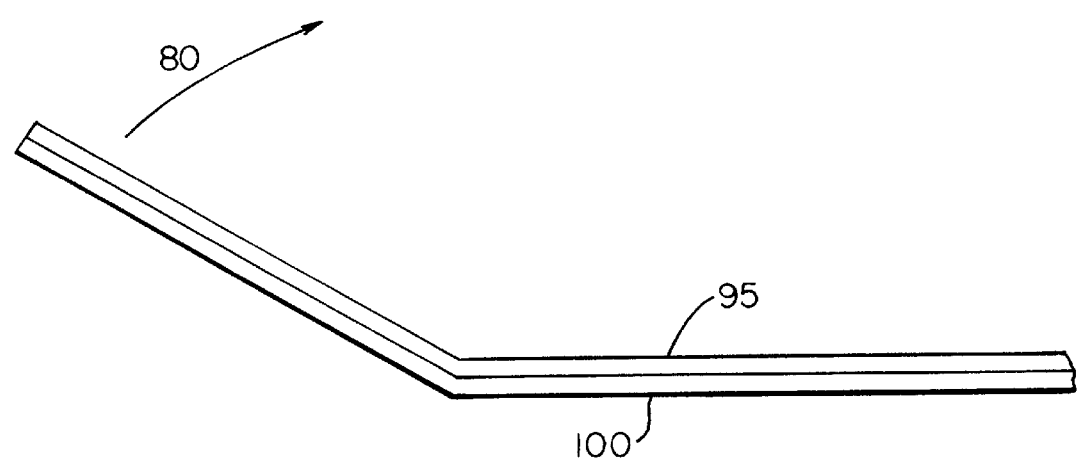
FIG. 3c

PROTECTIVE PACKAGE HAVING A PLURALITY OF POUCHES

BACKGROUND OF THE INVENTION

The present invention relates to protective packages and, more particularly, protective packages which provide the contents thereof with protection from damage caused by static electricity or electromagnetic radiation such as those used to transport electronic components.

Protective packages, particularly those used for transporting electronic components while shielding the components from such potentially damaging environmental factors as static electricity, electromagnetic radiation or electric fields, are often formed from a single sheet of a laminated material which is folded over upon itself and heat sealed along its edges. An example of such a protective package is disclosed in U.S. Pat. No. 4,658,958 issued to McNulty et al.

When transporting a protective package, it is often desirable to transport supporting documents or materials along with the primary contents of the package. For this purpose, protective packages sometimes include an outer pouch. These outer pouches are typically formed by sealing an additional sheet of material to the side of a finished protective package. This necessitates an additional step in the overall package-making process which has to be performed either by hand or by using additional machinery.

It is therefore the primary object of the present invention to provide a protective package having at least one outer pouch for containing supporting documentation or materials which can be constructed without the additional step of sealing a sheet of material to the side of the finished package.

SUMMARY OF THE INVENTION

Disclosed is a protective package having at least one outer pouch which can be manufactured without the additional step of sealing a sheet of material to the outside of the finished package. The package 5 includes an inner folded rectangular sheet 15 disposed within an outer folded rectangular sheet 10. The inner and outer sheets are sealed together along their aligned side edges by means of heat sealing or any other suitable means. A protective inner pouch 50, for containing the primary contents of the package, is defined by the inner sheet 15 while at least one outer pouch 45, suitable for containing documentation or other material associated with the primary contents of the package, is defined by the inner sheet 15 in combination with the outer sheet 10. The inner sheet is made of a material, such as a laminate, which provides the contents of the inner pouch with additional protection from environmental factors such as static electricity, electromagnetic radiation or electric fields.

To construct the package, a web of material 95 suitable for use as the inner sheet 15 is superimposed upon a web of material 100 suitable for use as the outer sheet 10. The two webs are then folded together until the top web 95 has been doubled over upon itself. The two webs are then sealed together along their common edges and severed withwise resulting in a finished protective package having at least one outer pouch.

BRIEF DESCRIPTION OF THE DRAWINGS

The invention can be better understood by reference to The Detailed Description of the Invention and the drawings of which:

FIGS. 3b—3d are side views of the webs of FIG. 3a before, during and after folding, respectively;

DETAILED DESCRIPTION OF THE INVENTION

Figure 1A:
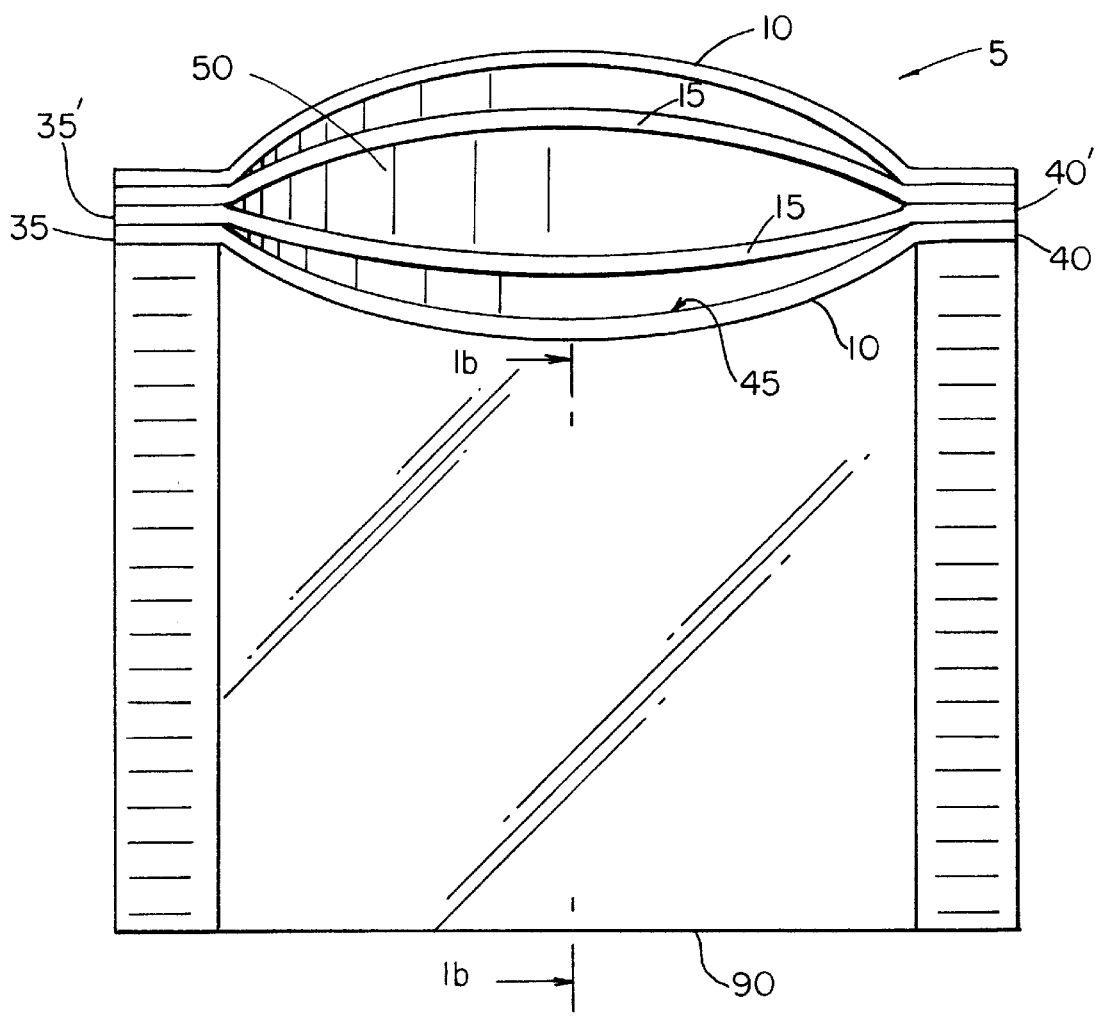
FIG. 1a is a perspective view of the protective package according to one structural embodiment of the invention.
Figure 1B:
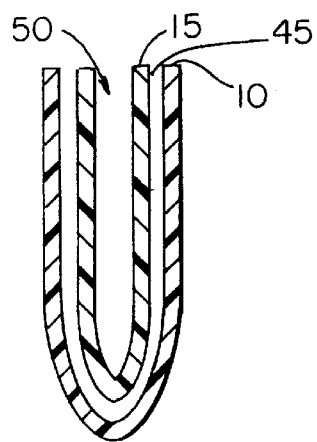
FIG. 1b fragmentary cross sectional view of the protective package of FIG. 1a taken along lines 1b—1b.

Referring collectively to FIGS. 1a and 1b, a protective package 5 in accordance with one embodiment of the invention is shown. The package includes a protective inner pouch 50 for storing the primary contents of the package and an outer pouch 45 for attaching literature, components or any other material which needs to accompany the contents of the protective inner pouch 50. The package 5 includes an outer bag defined by a folded rectangular sheet 10 of material having environmental-protection properties. The phrase "environmental-protection property" as used in the specification and claims refers to a materials ability to provide resistance to a particular environmental factor. Examples of such environmental factors include, without limitation, light and other forms of electromagnetic radiation, humidity, static electricity, dust, mechanical shock and electric fields. If, for example, electronic components are to be packaged within the protective inner pouch 50, with accompanying literature stored in the outer pouch, the outer sheet 10 is preferably composed of a clear, anti-static, heat-sealable plastic such as polyethylene. The package also includes an inner bag defined by another folded rectangular sheet 15 disposed in substantial alignment within the folded outer sheet 10. The inner sheet 15 is made from a different material than the outer sheet 10 and has at least one environmental-protection property not provided by the material used to make the outer sheet. The material used to make the inner sheet 15 depends upon the contents intended to be packaged within the protective inner pouch 50. Again, if it is electronic components that are to be packaged, the inner sheet 15 is preferably composed of a laminated material including a layer of anti-static, heat-sealable plastic and a layer of conductive material. The outer sheet 10 and the inner sheet 15 are sealed together along their aligned side edges (35 and 35') and (40 and 40') by heat sealing or any other suitable means. The suitability of a of a particular sealing means for use with this embodiment of the package is dictated by the desiderata of maintaining the conductive layer of the inner sheet 15 in electrical contact with itself along the side edges of the inner sheet (35' and 40') as well as providing the protective inner pouch 50 and the outer pouch 45 with environmental isolation from each other and the ambient environment. The protective inner pouch 50 is defined by the inner sheet 15, which provides the contents thereof with static shielding (Faraday Cage Effect). The protective inner pouch 50 is particularly useful for protecting electronic components, or other electrosensitive components, packaged therein from electrostatic damage. The outer pouch 45 is defined by the inner sheet 15 in combination with the outer sheet 10.

As an additional example, if the contents to be placed within the inner protective pouch 50 are sensitive to light, and it is desired that the materials which need to accompany the contents of the inner protective pouch be visible outside the package; it would be desirable to use an opaque material for the inner sheet 15 and a transparent material for the outer sheet 10. In this case, the additional environmental-protection property of the inner sheet 15 not provided by the outer sheet 10 is resistance to light.

Figure 2A:
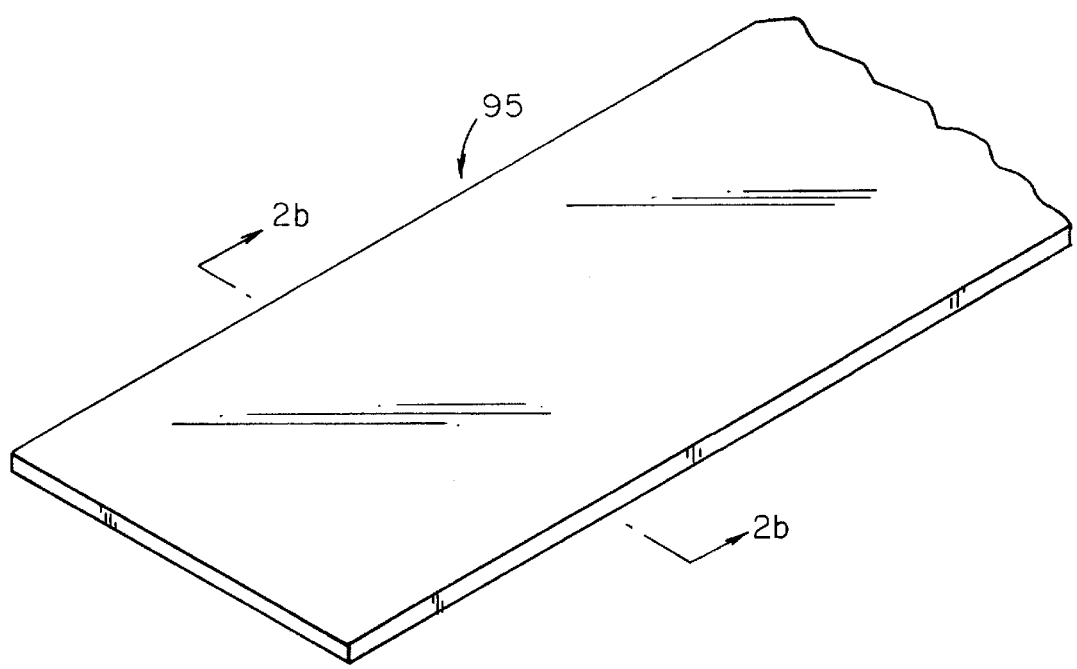
FIG. 2a respective view of a web of laminated material suitable for use in one embodiment of the invention.
Figure 2B:
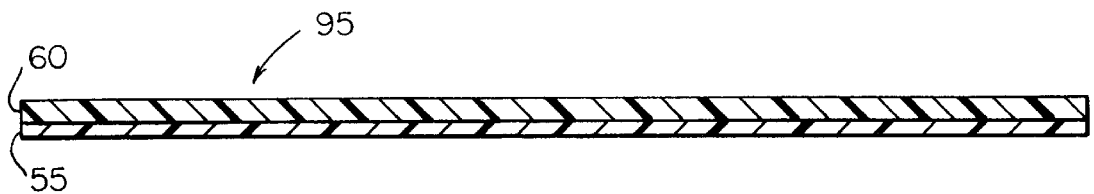
FIG. 2b is a fragmentary cross sectional view of the web of FIG. 2a taken along lines 2b—2b.

Referring now to FIGS. 2a and 2b, collectively, a web of laminated material 95 suitable for use in making the inner sheet 15 of the protective package 5 is shown. The laminate 95 is formed by depositing a layer of conductive metal 55 on a web of an anti-static, heat-sealable plastic 60. The thickness of the conductive metal layer 55 depends upon the type of metal selected and the desired surface conductivity of the laminate 95. The conductive metal layer 55 is continuous and can be deposited on the plastic web 60 by any means available such as vacuum deposition or sputter metallization. Examples of other laminates suitable for use in making the inner sheet 15 of the package 5 and for protecting the contents of the inner protective pouch 50 from such potentially damaging environmental factors as mechanical shock, static electricity, electromagnetic radiation and electric fields are disclosed in U.S. Pat. No. 4,471,872 issued to Dedow, U.S. Pat. No. 4,658,958 issued to McNulty et al., U.S. Pat. No. 4,875,581 to Ray et al., U.S. Pat. No. 4,987,997 issued to Raszewski et al. and U.S. Pat. No. 5,097,949 issued to Heldwein. The disclosures of each of these U.S. Patents are hereby incorporated by reference.

Figure 3A:
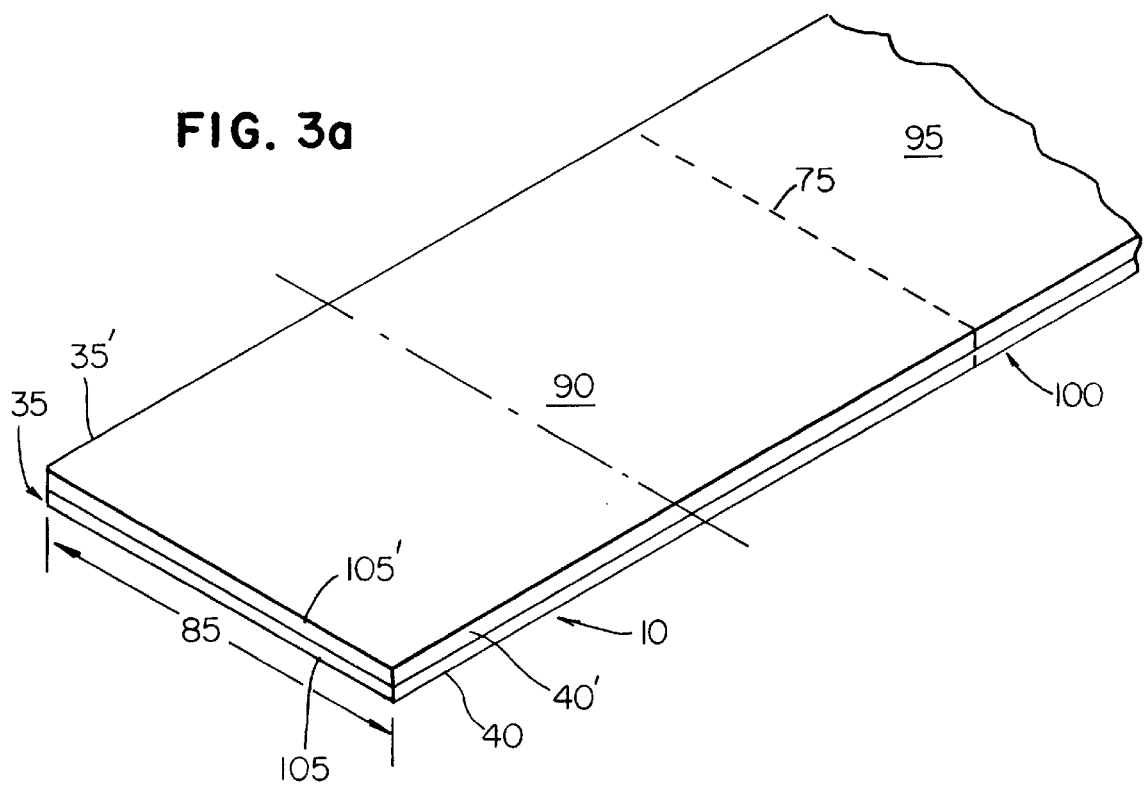
FIG. 3a is a perspective view of one web superimposed upon another prior to folding.
Figure 3D:
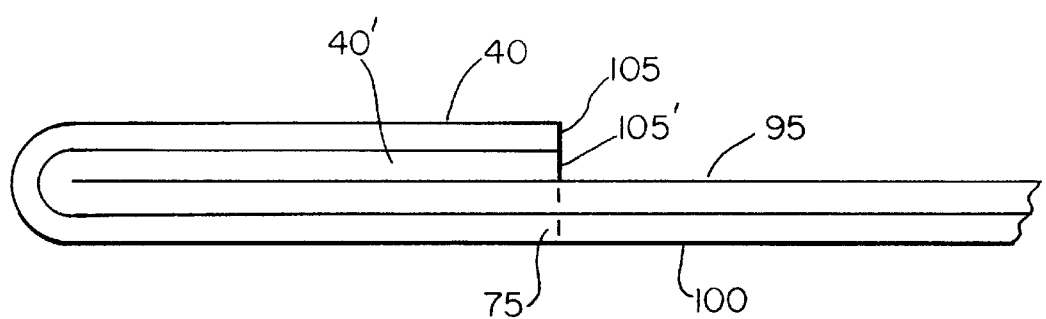
Figure 4A:
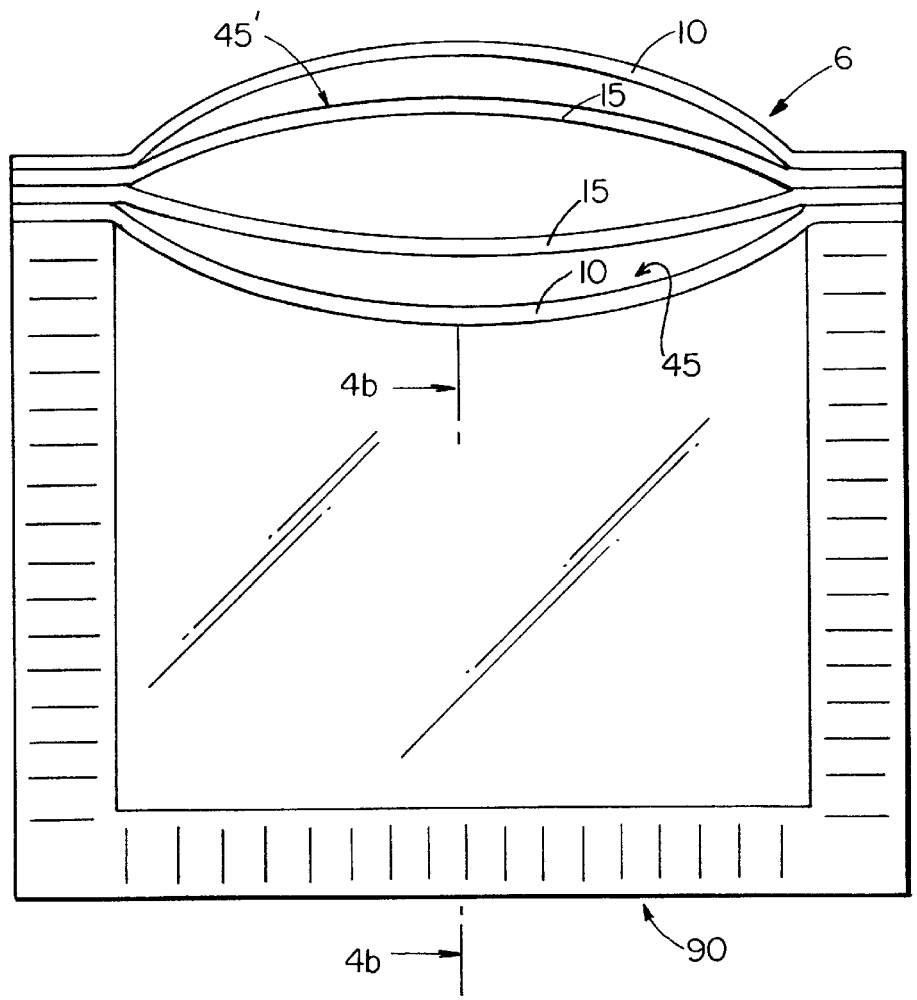
FIG. 4a is a perspective view of the protective package according to another structural embodiment of the invention.
Figure 4B:
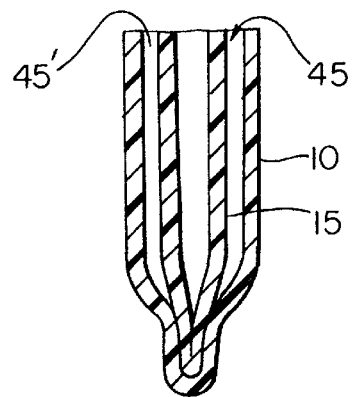
FIG. 4b is a fragmentary cross sectional view of the protective package of FIG. 4a taken along lines 4b—4b.
Figure 5A:
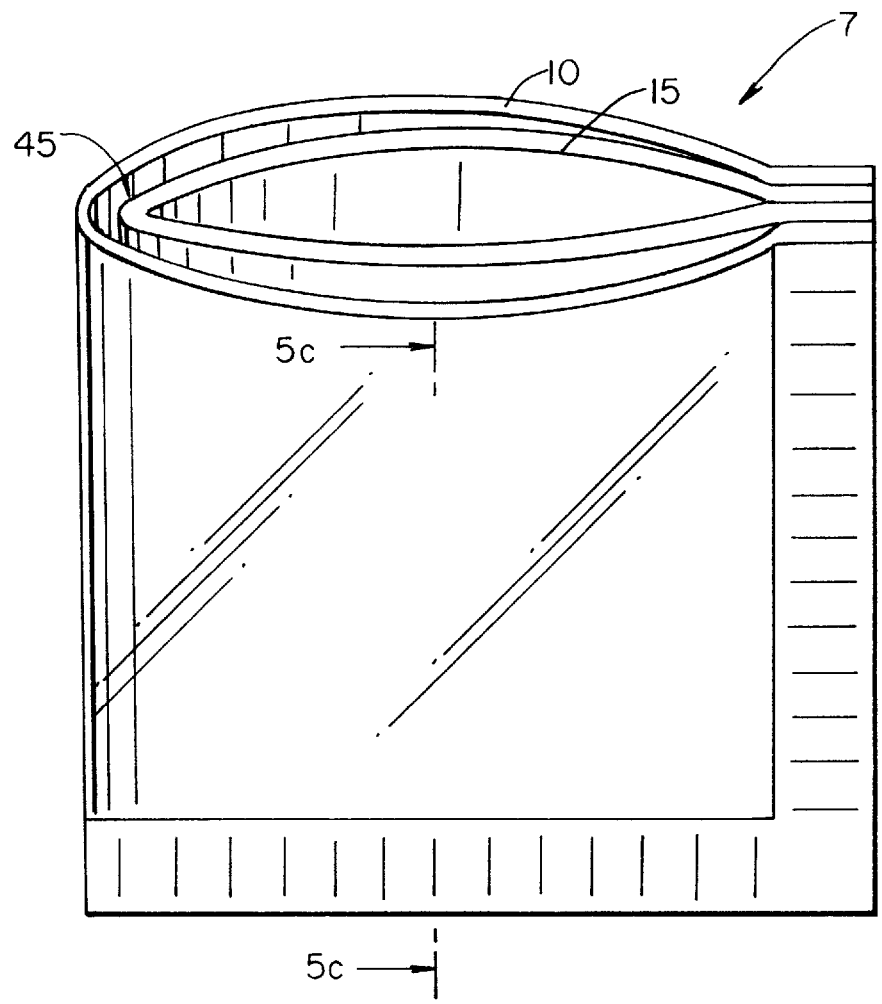
FIGS. 5a and 5b are perspective views of the protective package according to two more structural embodiments of the invention.
Figure 5C:
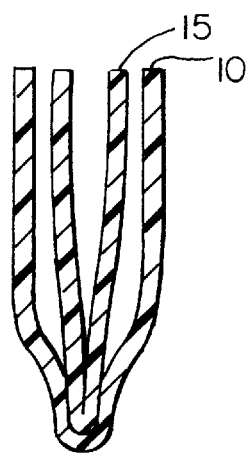
FIG. 5c is a fragmentary cross sectional view of the protective package of FIG. 5a or FIG. 5b taken along lines 5c—5c.
Figure 5B:
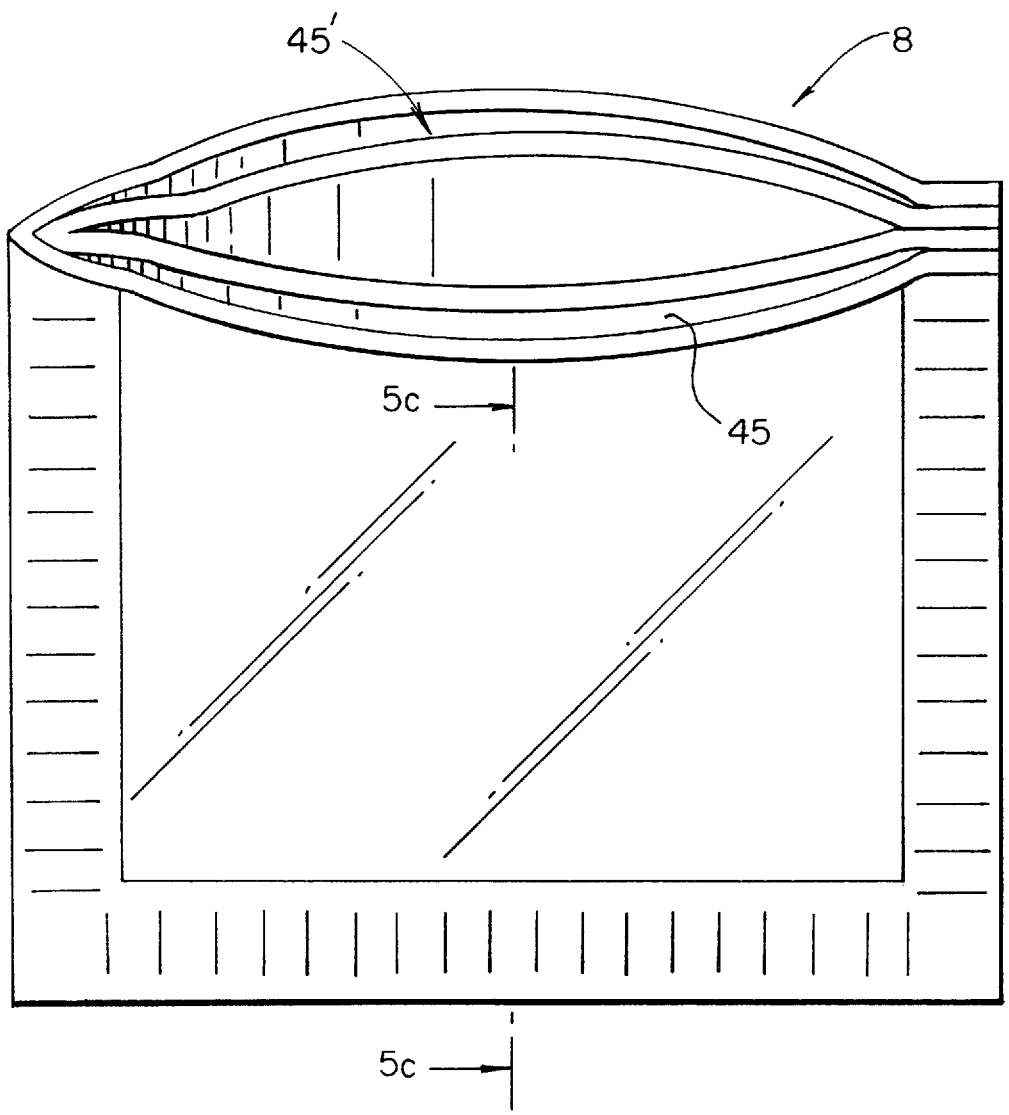

FIGS. 3a, 3b, 3c and 3d collectively illustrate a preferred method of making the protective package 5. Initially, a web of material 95 suitable for use as the inner sheet 15 (eg., any of the laminates disclosed above) is superimposed upon a web of material 100 suitable for use as the outer sheet (eg., a clear, anti-static, heat-sealable plastic). The two webs have substantially identical widths 85 and are in alignment with respect to both the side edges (35 and 35') and (40 and 40') and the front edges (105 and 105'). The webs are then folded together widthwise (arrow 80) about a common fold line 90 until the top web 95 has been doubled over upon itself (FIG. 3d). The next step is to heat seal the webs together in the areas adjacent the side edges (35 and 35') and (40 and 40'). Finally, the webs are severed widthwise through a cross-sectional area 75 subtantially flush with respect to the front edges of the webs (105 and 105'). Additionally, the webs can be sealed together in the area adjacent the common fold line 90 resulting in a package 6 as shown in FIGS. 4a and 4b, collectively, having two outer pouches (45 and 45') each defined by the inner and outer sheets (15 and 10, respectively). Alternatively, the webs can be sealed together in an area adjacent to where the the webs are to be severed 75 along with the area adjacent one of the side edges (40 and 40') resulting in a package 7 as shown in FIGS. 5a and 5c, collectively, having a single outer pouch 45 defined by the inner and outer sheets (15 and 10, respectively). This package can also be sealed in the area adjacent the common fold line 90 resulting in a package 8 as shown in FIGS. 5b and 5c, collectively, having two outer pouches (45 and 45'). The folding, sealing, and severing steps described above can all be performed automatically using packaging machinery well known to the art.

Figure 6A:
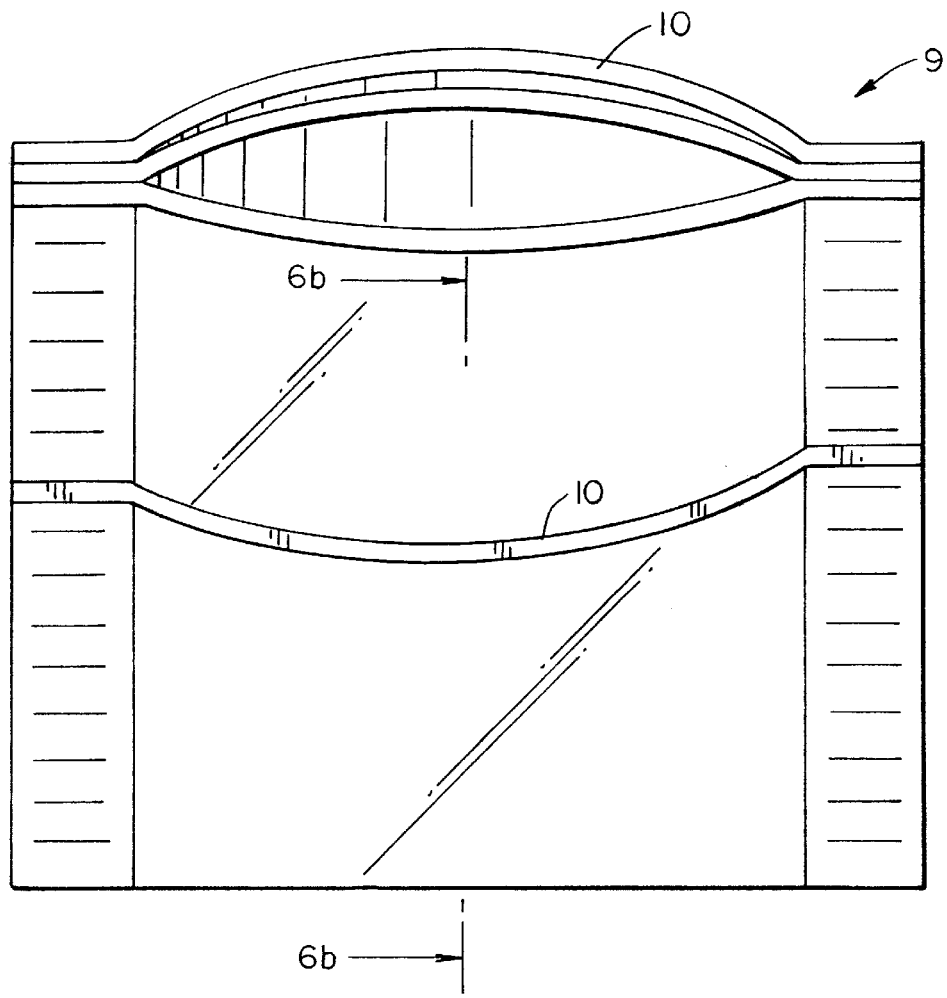
FIG. 6a is a perspective view of the protective package according to yet another embodiment of the invention.
Figure 6B:
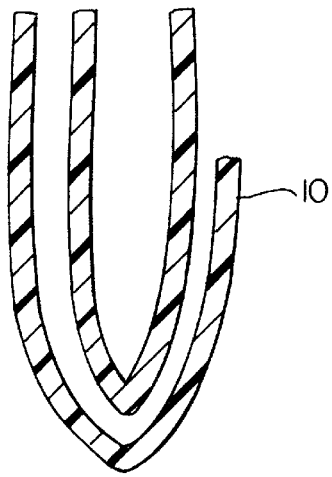
FIG. 6b is a fragmentary cross sectional view of the protective package of FIG. 6a taken along lines 6b—6b.

FIGS. 6a and 6b collectively disclose still another structural embodiment of the invention. In this embodiment, the outer sheet 10 extends only partially up the front of the package 9. In making this embodiment, it might be desirable to start out using two superimposed webs having different widths. The webs can then be folded together lengthwise prior to sealing the webs together.

It should be understood that various changes and modifications to the preferred embodiments described above, with respect to both the structure of the package and the materials used in making the package, will be apparent to those skilled in the art without departing from the spirit and scope of the present invention.

I claim:

1. A protective package, comprising:

on outer bag;

an inner bag disposed within said outer bag; said inner bag defining an inner pouch; said outer bag being made from a first material having environmental-protection properties;

said inner bag being made from a second material which is laminated and also has environmental-protection properties including at least one environmental-protection property not provided by the first material; and said inner bag being sized to fill said outer bag with at least one outer pouch being defined between said inner and outer bags with the inner pouch being environmentally isolated from the at least one outer pouch.

2. A protective package as cited in claim 1, wherein the second material includes at least one layer of conductive material.

3. A protective package as cited in claim 1, wherein the second material includes at least one layer of anti-static material.

4. A protective package as cited in claim 1, wherein the first material has anti-static properties.

5. A protective package, comprising:

a folded outer sheet having at least one side edge and made from a first material having environmental-protection properties;

a folded inner sheet also having at least one side edge and made from a second material also having environmental-protection properties including at least one environmental-protection property not provided by the first material; and said folded inner sheet being disposed within said folded outer sheet with the at least one side edge of said inner sheet being substantially in alignment with the at least one side edge of said outer sheet; and said inner and outer sheets being sealed together along the side edges with said inner sheet defining an inner pouch and said inner and outer sheets together defining at least one outer pouch with the inner pouch being environmentally isolated from the at least one outer pouch.

6. A protective package as cited in claim 5, wherein the second material is laminated.

7. A protective package as cited in claim 6, wherein the second material includes a layer of conductive material.

8. A protective package as cited in claim 6, wherein the second material includes a layer of anti-static material.

9. A protective package as cited in claim 5, wherein the first material has anti-static properties.

10. A protective package as cited in claim 5, wherein the second material is more resistant to light than the first material.

11. A protective package, comprising:
- a folded rectangular outer sheet having two side edges and made from a first material having environmental-protection properties;
- a folded rectangular inner sheet also having two side edges and made from a second material also having environmental-protection properties including at least one environmetal-protection property not provided by the first material;
- said folded inner sheet being disposed within said folded outer sheet with the side edges of said inner sheet being substantially in alignment with the side edges of said outer sheet; and said inner and outer sheets being sealed together along the side edges with said inner sheet defining an inner pouch and said inner and outer sheets together defining at least one outer pouch with the inner pouch being environmentally isolated from the at least one outer pouch.

12. A protective package as cited in claim 11, wherein the second material is laminated.

13. A protective package as cited in claim 12, wherein the second material includes a layer of conductive material.

14. A protective package as cited in claim 12, wherein the second material includes a layer of anti-static material.

15. A protective package as cited in claim 11, wherein the first material has anti-static properties.

16. A protective package as cited in claim 11, wherein the second material is more resistant to light than the first material.

* * * * *